(12) United States Patent
Hwang et al.

(10) Patent No.: US 9,320,157 B2
(45) Date of Patent: Apr. 19, 2016

(54) DISPLAY DEVICE

(71) Applicant: SAMSUNG DISPLAY CO., LTD., Yongin-si, Gyeonggi-do (KR)

(72) Inventors: Sang-Ho Hwang, Suwon-si (KR); Jae-Sang Lee, Asan-si (KR); Kwang-Wook Choi, Osan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/533,824

(22) Filed: Nov. 5, 2014

(65) Prior Publication Data

US 2015/0289396 A1 Oct. 8, 2015

(30) Foreign Application Priority Data

Apr. 2, 2014 (KR) ........................ 10-2014-0039174

(51) Int. Cl.
*H05K 5/02* (2006.01)
(52) U.S. Cl.
CPC .................................. *H05K 5/0204* (2013.01)
(58) Field of Classification Search
CPC .............. G02F 1/133308; G02F 2001/133314; H05K 5/0204; F16M 11/00; H04N 5/64
See application file for complete search history.

(56) References Cited

U.S. PATENT DOCUMENTS

| | | | |
|---|---|---|---|
| 2005/0218273 A1 | 10/2005 | Huang | |
| 2005/0236548 A1* | 10/2005 | Maruta | G06F 1/1601 248/476 |
| 2005/0264985 A1 | 12/2005 | Kim et al. | |
| 2011/0017888 A1 | 1/2011 | Sangiuliano | |
| 2011/0163052 A1 | 7/2011 | Kim et al. | |

FOREIGN PATENT DOCUMENTS

| | | |
|---|---|---|
| JP | 2009-265223 | 11/2009 |
| JP | 2012-128336 | 7/2012 |
| KR | 10-2002-0026107 | 4/2002 |
| KR | 10-2003-0094485 | 12/2003 |
| KR | 10-2005-0051150 | 6/2005 |
| KR | 10-2007-0011944 | 1/2007 |
| KR | 10-2010-0124451 | 11/2010 |
| KR | 10-2013-0012270 | 2/2013 |
| KR | 10-2013-0013131 | 2/2013 |

* cited by examiner

*Primary Examiner* — Anne Hines
(74) *Attorney, Agent, or Firm* — Innovation Counsel LLP

(57) ABSTRACT

A display device including: a display panel; a chassis base that houses the display panel on one side and comprises at least one pair of supporting bosses on the other side; and a wall-mount holder that is connected to the pair of supporting bosses and includes a supporting rod coupling hole, wherein the pair of supporting bosses includes a first supporting boss and a second supporting boss, and wherein the first supporting boss and the second supporting boss include a guide pin and a screw groove.

12 Claims, 5 Drawing Sheets

DISPLAY DEVICE

CROSS-REFERENCE TO RELATED APPLICATION

This application claims priority to and the benefit of Korean Patent Application No. 10-2014-0039174, filed on Apr. 2, 2014, with the Korean Intellectual Property Office, the disclosure of which is incorporated herein in its entirety by reference.

BACKGROUND

1. Field

The present disclosure of system and method relates to a display device that includes a wall-mount holder.

2. Description of the Related Art

Recently, there has been growing attention to flat panel display devices such as a liquid crystal display (LCD), a field emission display (FED), a plasma display panel (PDP), an organic light emitting display (OLED), and the like.

These display devices generally include: a display panel on which images are displayed; a chassis base on which the display panel is installed; a plurality of circuit substrates which are installed on the chassis base on the opposite side from the display panel and include various driving circuit units disposed thereon; and a cover that is configured to cover and protect the display panel, the chassis base, and the circuit substrates. The cover may include a front cover and a back cover.

The display devices may be categorized into a stand type, a wall-mount type, or both, depending on the installation method associated with the display device. A stand type display device may, for example, have a structure in which one or more legs extend from the chassis base to enable the display panel to stand upright on its own. A wall-mount type display device may, for example, have a structure in which the display panel can be mounted on a wall using a wall-mount holder that is configured to fix the display panel on the wall. Recently, the wall-mount type display device has drawn attention because of its tendency to economize space.

In the case of a wall-mount type display device, the wall-mount holder may be coupled and fixed to the chassis base using, for example, a supporting boss by a bolt, a screw, and the like. The wall-mount-holder may be fixed on the wall on which a wall-mount support is installed by using a wall-mount supporting rod, such as a screw or a stick. In such case, the wall-mount supporting rod passes through a hole formed on the back cover to connect the wall-mount holder with the wall-mount support. The hole of the wall-mount holder has a predetermined gap and size in accordance with, for example, the VESA standard. Accordingly, in a case in which the position of the hole of the wall-mount holder is limited, it may be difficult to fix the wall-mount holder on the chassis base.

SUMMARY

The present disclosure is directed to a display device that includes a wall-mount holder that is configured to fix the display panel on a wall.

According to an embodiment of the present system and method, a display device may include: a display panel; a chassis base that housing the display panel on one side and at least one pair of supporting bosses on the other side; and a wall-mount holder that is connected to the pair of supporting bosses and includes a supporting rod coupling hole, wherein the pair of supporting bosses includes a first supporting boss and a second supporting boss, and wherein the first supporting boss and the second supporting boss include a guide pin and a screw groove.

The first supporting boss and the second supporting boss may have the same height with respect to one surface of the display panel.

The chassis base may include a flat portion and an inclined portion that extends from the flat portion, the first supporting boss may be disposed on the inclined portion, and the second supporting boss may be disposed on the flat portion.

The guide pin and the screw groove of the first supporting boss may be alternately disposed with the guide pin and the screw groove of the second supporting boss.

The pair of supporting bosses may be disposed adjacent to corners of the chassis base with respect to a center portion of the chassis base.

The wall-mount holders may be disposed at four areas adjacent to the respective corners of the chassis base.

The wall-mount holder may include a protrusion that protrudes outward from the chassis base and a pair of legs that extends from the protrusion.

A supporting rod coupling hole may be formed on the protrusion.

The pair of legs may be disposed on the pair of supporting bosses.

The pair of legs may include a first leg and a second leg and the first leg and the second leg may include a guide pin hole and a screw hole.

The guide pins of the first supporting boss and the second supporting boss may be inserted into the guide pin holes of the first leg and the second leg, respectively.

The first leg and the second leg may be fixed to the first supporting boss and the second supporting boss by a fixing member, respectively.

The display panel may be one of a plasma display panel, a liquid crystal display panel, and an organic light emitting display panel.

According to embodiments of the present system and method, the chassis base including the supporting boss and the wall-mount holder provided in a bracket form are fixed by a guide pin and a screw, such that the display device can be stably fixed on the wall.

BRIEF DESCRIPTION OF THE DRAWINGS

The features and aspects of the present system and method will be more clearly understood from the following detailed description taken in conjunction with the accompanying drawings, in which.

Figure 1:
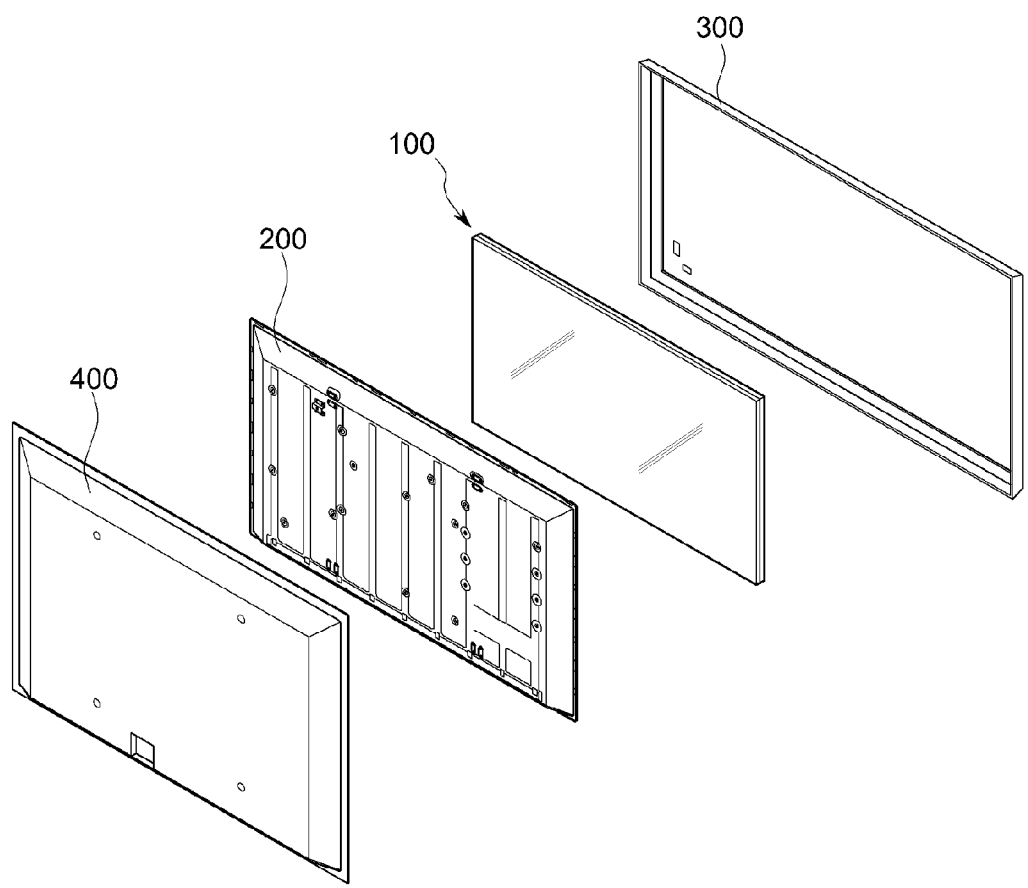
FIG. 1 is an exploded perspective view showing a display device according to an embodiment of the present system and method.

The accompanying drawings of the figures, which are included as part of the present disclosure, illustrate various embodiments, and together with their description herein, serve to explain and teach the principles of the present system and method. The figures, however, do not describe every aspect of the teachings disclosed herein and do not limit the scope of the claims. Furthermore, the figures are not necessarily drawn to scale, and like reference numerals refer to like elements throughout the specification.

DETAILED DESCRIPTION

Hereinafter, embodiments of the present system and method are described in reference to the accompanying drawings.

Although specific embodiments are illustrated in the accompanying drawings and referenced in the specification, the present system and method can be modified in various manners and encompass embodiments not expressly disclosed. The scope of the embodiments of the present system and method are not limited to the specific embodiments and should be construed as including all the changes, equivalents, and substitutions that are within the spirit and scope of the present system and method.

When a layer or element is referred to as being "on" another layer or element, the layer or element may be directly on the other layer or element, or one or more intervening layers or elements may be interposed therebetween.

FIG. 1 is an exploded perspective view that shows a display device according to an embodiment of the present system and method. The display device includes a display panel 100 that displays an image, a chassis base 200 on which the display panel is installed, a front cover 300 and a back cover 400 that are configured to cover and protect the display panel 100 and the chassis base 200.

The display panel 100 may be one of a plasma display panel, a liquid crystal display panel, and an organic light emitting display panel.

In a case where the display panel 100 is a plasma display panel, the display panel 100 may include display electrodes arranged along discharge cells configured to discharge gas and address electrodes arranged to intersect the display electrodes.

In a case where the display panel 100 is a liquid crystal display panel, the display panel 100 may include a pair of electrodes and liquid crystals whose alignment is changed in accordance with voltage applied to the pair of electrodes.

In a case where the display panel 100 is an organic light emitting display panel, the display panel 100 may include a pair of electrodes and a light emitting layer interposed between the pair of electrodes.

Hereinafter, an embodiment of the present system and method is described with respect to a display panel 100 that is a liquid crystal display panel.

Figure 2:
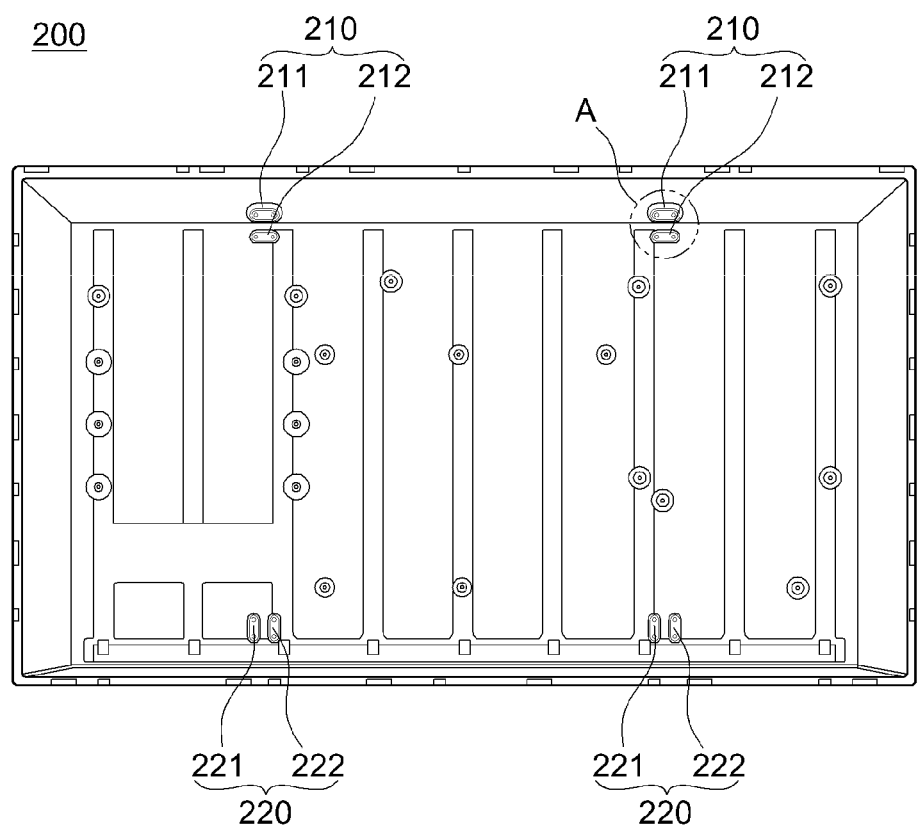
FIG. 2 is a back view that shows a chassis base illustrated in FIG. 1.

FIG. 2 is a back view that shows the chassis base 200 illustrated in FIG. 1.

The chassis base 200 may be formed from a rigid material that is capable of supporting the display panel 100 and may include a circuit substrate that contains various driving circuits. The chassis base 200 may further include, for example, a heat releasing member and/or an electromagnetic wave blocking member to effectively release and/or block heat and electromagnetic waves that may be produced from the display panel 100 and the circuit substrate. The circuit substrate may be interposed between one side of the display panel 100 and the chassis base 200 (not illustrated).

If the display device is a liquid crystal display device, a backlight unit may be disposed between the display panel 100 and the chassis base 200. Furthermore, if the liquid crystal display device uses a direct-type backlight unit, the chassis base 200 may have an inclined portion at a corner portion.

The chassis base 200 includes at least one pair of supporting bosses 210 and 220 that are disposed on the surface that is opposite to the surface where the display panel 100 is disposed. Each pair of supporting bosses 210 and 220 includes first supporting bosses 211 and 221 and second supporting bosses 212 and 222.

The supporting bosses 210 and 220 may be disposed near the edges and corners of the chassis basis 200. For example, as FIG. 2 illustrates, the supporting bosses 210 and 220 may disposed at the top, at the bottom, on the left, and on the right with respect to a center portion of the chassis base 200 in accordance with VESA standards.

FIG. 2 illustrates that the first supporting boss 211 and the second supporting boss 212 of the pair of the supporting bosses 210 may be disposed at the top of the chassis base 200 and may be wider (e.g., in the vertical direction of FIG. 2) than they are longer (e.g., in the horizontal direction of FIG. 2). The first supporting boss 221 and the second supporting boss 222 of the pair of the supporting bosses 220, on the other hand, may be disposed at the bottom of the chassis base 200 and may be longer than they are wider.

The above-described embodiment of the present system and method, however, is not limited thereto, and the supporting bosses 211, 212, 221, and 222 may be arranged and/or shaped differently from those shown in FIG. 2. For example, all of the first supporting bosses 211 and 221 and the second supporting bosses 212 and 222 disposed at the top and the bottom may be wider than they are longer.

The chassis base 200 of the FIG. 2 may have inclined portions at the corner portions. In other words, the chassis base 200 may have a flat portion, which refers to a portion other than an inclined portion, from which an inclined portion extends. In the case of FIG. 2, the first supporting boss 211 of the pair of supporting bosses 210 at the top of the chassis base 200 is disposed on the inclined portion of the chassis base 200, and the second supporting boss 212 is disposed on the flat portion of the chassis base 200. The first supporting boss 221 and the second supporting boss 222 of the pair of supporting bosses 220 at the bottom of the chassis base 200 are disposed on the flat portion of the chassis base 200.

However, the above-described embodiment of the present system and method is not limited thereto. For example, any one of the first supporting boss 221 and the second supporting boss 222 of the pair of supporting bosses 220 at the bottom of the chassis base 200 may be disposed on the inclined portion of the chassis base 200. In an embodiment in which the chassis base 200 is larger, both of the first supporting boss 211 and the second supporting boss 212 at the top of the chassis base 200 may be disposed on the flat portion of the chassis base 200.

The pairs of the supporting bosses 210 and 220 and the chassis base 200 may be formed together. For example, the pair of supporting bosses 210 and 220 and the chassis base 200 may be formed in a single process by molding.

Figure 3:
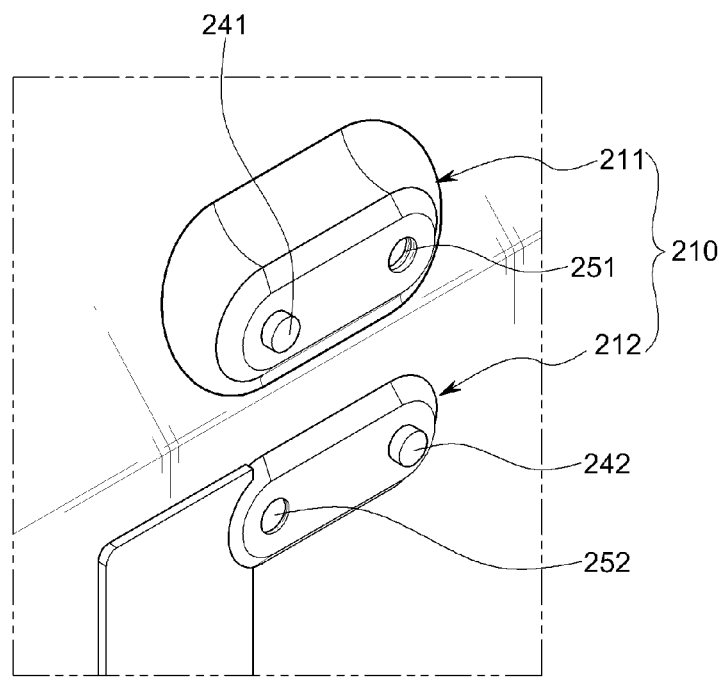
FIG. 3 is an enlarged perspective view of an area of FIG. 2 denoted as "A"

FIG. 3 is an enlarged perspective view of an area of FIG. 2 denoted as "A." Referring to FIG. 3, the first supporting boss 211 of the pair of supporting bosses 210 is disposed on the inclined portion of the chassis base 200 and protrudes from the inclined portion. Further, the second supporting boss 212 is disposed on the flat portion of the chassis base 200 and protrudes from the flat portion. The protrusions that form the supporting bosses 211 and 212 may include flat top surfaces that lie on a common plane in which the common plane is parallel to the plane on which the flat portion of the chassis base 200 lies. That is, when measuring the height from the flat portion of the chassis base 200, the top surface of the first supporting boss 211 may have the same height as the top surface of the second supporting boss 212.

When the top surface of the first supporting boss 211 has the same height as the top surface of the second supporting boss 212, the wall-mount holder 501 may be stably fixed to the pair of the supporting bosses 210. As a result, when the display device is mounted on the wall, the load applied on the wall-mount holder 501 may be evenly distributed on the chassis base 200.

In addition, the first supporting boss 211 and the second supporting boss 212 may include guide pins 241 and 242 and screw grooves 251 and 252, respectively. The guide pins 241 and 242 are configured to determine the position of the wall-mount holder 501, and the screw grooves 251 and 252 are configured to accommodate screws for connecting the wall-mount holder 501 to the supporting bosses 211 and 212. To stably connect the wall-mount holder 501 and the supporting bosses 211 and 212, the guide pin 241 and the screw groove 251 of the first supporting boss 211 may be alternately disposed with the guide pin 242 and the screw groove 252 of the second supporting boss 212, as FIG. 3 illustrates.

Figure 4:
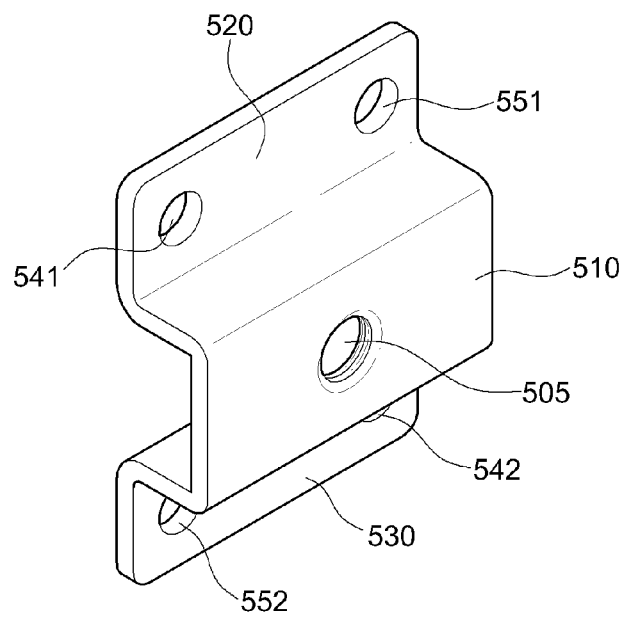
FIG. 4 is a perspective view that shows an embodiment of a wall-mount holder.

FIG. 4 is a perspective view that shows a wall-mount holder 501 according to an embodiment of the present system and method. The wall-mount holder 501 couples to the supporting bosses 210 and 220 and includes a supporting rod coupling hole 505. The wall-mount holder 501 has a structural rigidity that is sufficient to support the weight of the display device.

The wall-mount holder 501 has a protrusion 510 and is provided in a bracket form in which a pair of legs 520 and 530 extend from the protrusion 510. When the wall-mount holder 501 is coupled with the pair of supporting bosses 210 and 220 on the chassis base 200, the protrusion 510 protrudes outward from the chassis base 200 in a direction away from the display panel 100.

The protrusion 510 includes the supporting rod coupling hole 505. A supporting rod 710 (refer to FIG. 6) inserts into the supporting rod coupling hole 505 when the display device is fixed on the wall.

The pair of legs includes a first leg 520 and a second leg 530. The first leg 520 and the second leg 530 include guide pin holes 541 and 542 and screw holes 551 and 552, respectively.

Figure 5:
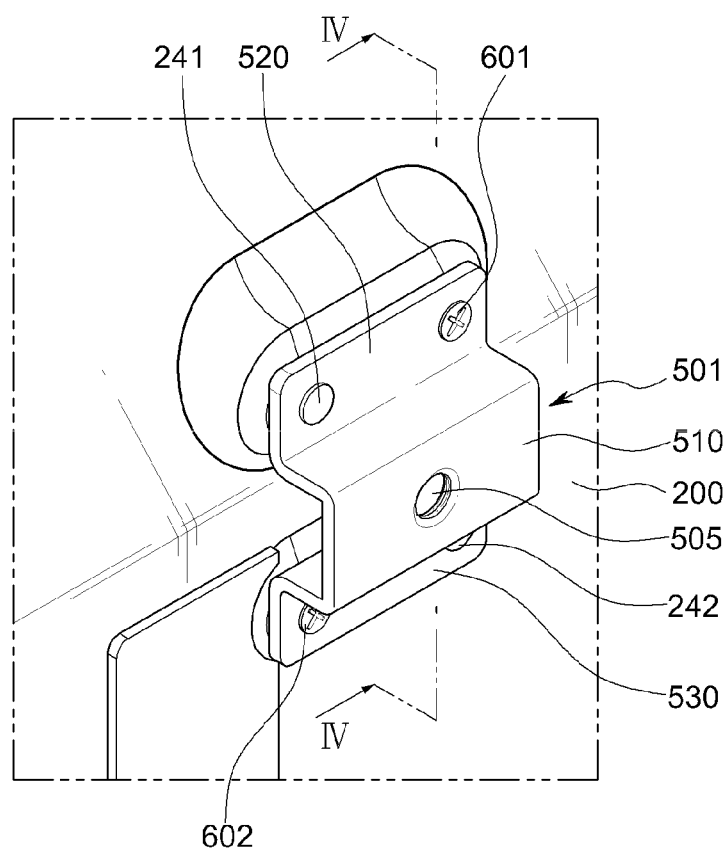
FIG. 5 is a partial perspective view that shows the wall-mount holder of FIG. 4 being mounted on a chassis base, according to one embodiment of the present system and method.

FIG. 5 is a partial perspective view that shows the wall-mount holder 501 of FIG. 4 being coupled to the pair of supporting bosses 210 of the chassis base 200 of FIG. 3. Particularly, the pair of legs 520 and 530 are disposed on and coupled to the pair of supporting bosses 210, such that the wall-mount holder 501 is fixed on the chassis base 200.

To install the wall-mount holder 501, guide pins 241 and 242 of the first supporting boss 211 and the second supporting boss 212 insert into the guide pin holes 541 and 542 of the first leg 520 and the second leg 530, respectively. When the guide pins 241 and 242 are inserted into the guide pin holes 541 and 542, the position of the wall-mount holder 501 is determined with respect to the chassis base 200 such that the screw grooves 251 and 252 of the first supporting boss 211 and the second supporting bosses 212 correspond to the screw holes 551 and 552 of the first leg 520 and the second leg 530. Subsequently, the first leg 520 and the second leg 530 may be fixed to the first supporting boss 211 and the second supporting boss 212, respectively, using fixing members such as screws 601 and 602.

As FIG. 5 illustrates, the screws 601 and 602 are alternately disposed with the guide pins 241 and 242. Because the screws 601 and 602 have a strong coupling force compared to the guide pins 241 and 242, applying the screws in diagonal directions from the first leg 520 and the second leg 530 of the wall-mount holder 501 stably fixes the wall-mount holder 501 to the chassis base 200. The wall-mount holder 501 may be disposed at 4 areas adjacent to the respective corners of the chassis base 200, such as to conform to the VESA standards.

Figure 6:
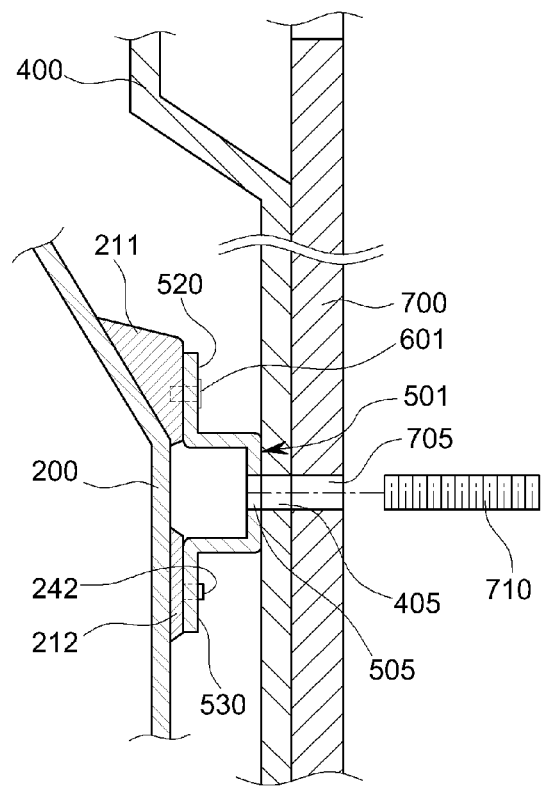
FIG. 6 is a cross-sectional view that shows a display device that is fixed on a wall-mount support 700, according to an embodiment of the present system and method.

FIG. 6 is a cross-sectional view that shows a display device that is fixed on a wall-mount support 700, according to an embodiment of the present system and method. FIG. 6 corresponds to the cross-section taken along a line IV-IV of FIG. 5. As illustrated in FIG. 6, the wall-mount holder 501 is disposed on the first supporting boss 211 and the second supporting boss 212 of the chassis base 200, and the back cover 400 is disposed to cover the chassis base 200. The back cover 400 includes a back cover hole 405 formed at an area that corresponds to the supporting rod coupling hole 505 of the wall-mount holder 501.

A wall-mount support 700 is used to mount the display device on the wall. The wall-mount support 700 may be fixed on the wall by a separate fixing member (not illustrated). The wall-mount support 700 is fixed to the wall-mount holder 501 by the supporting rod 710. In the case of FIG. 6, the wall-mount supporting rod 710 is configured to pass through the hole 405 formed on the back cover 400, the supporting rod coupling hole 505 of the wall-mount holder 501, and a supporting rod groove 705 of the wall-mount support 700 so as to connect the back cover 400, wall-mount holder 501 and the wall-mount support 700.

The supporting rod 710 may include, for example, a screw. If a screw is used as the supporting rod 710, screw threads may be formed on the supporting rod groove 705 of the wall-mount support 700 and the supporting rod coupling hole 505 of the wall-mount holder 501. The hole 405 of the back cover disposed between the wall-mount support 700 and the wall-mount holder 501 may also include screw threads.

Referring to FIG. 6, the top surface of the first supporting boss 211 and the second supporting boss 212 on which the first leg 520 and the second leg 530 are connected have the same height. As a result, the load of the display device being applied on the wall-mount holder 501 may be efficiently distributed to the chassis base 200 by the supporting rod 710.

Figure 7:
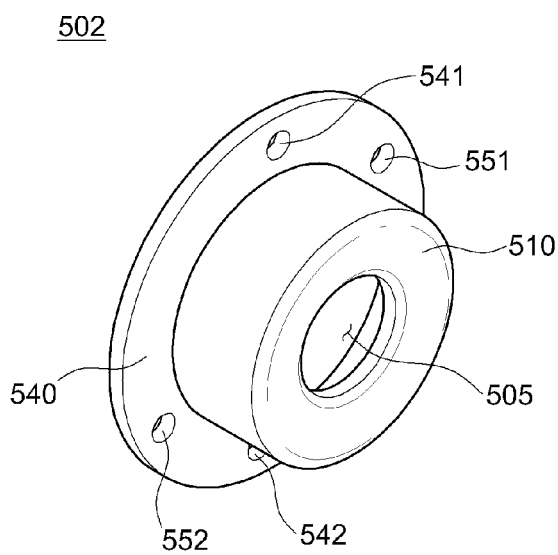
FIG. 7 is a perspective view showing a wall-mount holder according to another embodiment of the present system and method.

FIG. 7 is a perspective view that shows a wall-mount holder 502 according to another embodiment of the present system and method. The wall-mount holder 502 of FIG. 7 is provided in a circular bracket form that includes a protrusion 510 a circular leg 540 that extends from the protrusion 510. The protrusion 510 includes the supporting rod coupling hole 505, and the leg 540 includes guide pin holes 541 and 542 and screw holes 551 and 552.

From the foregoing, it is understood that various embodiments in accordance with the present disclosure are described herein for illustration purposes, and that various modifications may be made without departing from the scope and spirit of the present teachings. Accordingly, the various embodiments disclosed herein should not be construed to be limiting.

What is claimed is:
1. A display device comprising:
a display panel;
a chassis base housing the display panel on one side and comprising at least one pair of supporting bosses on the other side; and
a wall-mount holder connected to the pair of supporting bosses and comprising a supporting rod coupling hole, wherein the pair of supporting bosses comprises a first supporting boss and a second supporting boss, wherein the first supporting boss and the second supporting boss comprise a guide pin and a screw groove, wherein the wall-mount holder comprises a protrusion protruding outward from the chassis base and a pair of legs extending from the protrusion, wherein the pair of legs is on the pair of supporting bosses.

2. The display device of claim 1, wherein the first supporting boss and the second supporting boss have the same height with respect to one surface of the display panel.

3. The display device of claim 1, wherein the guide pin and the screw groove of the first supporting boss are alternately disposed with the guide pin and the screw groove of the second supporting boss.

4. The display device of claim 1, wherein the pair of supporting bosses is disposed adjacent to corners of the chassis base with respect to a center portion of the chassis base.

5. The display device of claim 1, wherein the wall-mount holders are disposed at four areas adjacent to the respective corners of the chassis base.

6. The display device of claim 1, wherein a supporting rod coupling hole is formed on the protrusion.

7. The display device of claim 1, wherein the pair of legs comprises a first leg and a second leg, and wherein the first leg and the second leg comprise a guide pin hole and a screw hole.

8. The display device of claim 7 wherein the guide pins of the first supporting boss and the second supporting boss are inserted into the guide pin holes of the first leg and the second leg, respectively.

9. The display device of claim 7, wherein the first leg and the second leg are fixed to the first supporting boss and the second supporting boss by a fixing member, respectively.

10. The display device of claim 1, wherein the display panel is one of a plasma display panel, a liquid crystal display panel, and an organic light emitting display panel.

11. The display device of claim 1, wherein the rod coupling hole is on a plane different from which the guide pin hole and screw hole are disposed.

12. A display device comprising:

a display panel;

a chassis base housing the display panel on one side and comprising at least one pair of supporting bosses on the other side; and a wall-mount holder connected to the pair of supporting bosses and comprising a supporting rod coupling hole, wherein the pair of supporting bosses comprises a first supporting boss and a second supporting boss, wherein the first supporting boss and the second supporting boss comprise a guide pin and a screw groove, wherein the chassis base comprises a flat portion and an inclined portion extending from the flat portion, wherein the first supporting boss is disposed on the inclined portion, and wherein the second supporting boss is disposed on the flat portion.

* * * * *